United States Patent
Yen et al.

(10) Patent No.: US 11,935,786 B2
(45) Date of Patent: Mar. 19, 2024

(54) CONTACT FEATURES OF SEMICONDUCTOR DEVICES

(71) Applicant: Taiwan Semiconductor Manufacturing Company Limited, Hsinchu (TW)

(72) Inventors: Tsui-Ling Yen, Hsinchu County (TW); Chien-Hung Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 60 days.

(21) Appl. No.: 17/872,942

(22) Filed: Jul. 25, 2022

(65) Prior Publication Data
US 2022/0359288 A1    Nov. 10, 2022

Related U.S. Application Data

(62) Division of application No. 17/192,600, filed on Mar. 4, 2021.

(51) Int. Cl.
*H01L 21/768* (2006.01)
*H01L 21/02* (2006.01)
(Continued)

(52) U.S. Cl.
CPC .. *H01L 21/76897* (2013.01); *H01L 21/76831* (2013.01); *H01L 21/76844* (2013.01); *H01L 23/5226* (2013.01); *H01L 29/401* (2013.01); *H01L 29/41725* (2013.01); *H01L 21/02164* (2013.01); *H01L 21/02211* (2013.01); *H01L 21/02271* (2013.01)

(58) Field of Classification Search
CPC ......... H01L 21/76897; H01L 21/76831; H01L 21/76844; H01L 23/5226; H01L 21/823871; H01L 21/76808; H01L 21/76816; H01L 2221/101; H01L 29/401; H01L 29/41725; H01L 27/092; H01L 21/76895; H01L 23/485; H01L 23/5283; H01L 23/528
See application file for complete search history.

(56) References Cited

U.S. PATENT DOCUMENTS 10,395,986 B1 * 8/2019 Briggs .............. H01L 21/76808
2015/0179499 A1   6/2015 Yang et al.
(Continued)

FOREIGN PATENT DOCUMENTS

TW        202008511 A     2/2020
TW        202013602 A     4/2020

*Primary Examiner* — Thanhha S Pham
(74) *Attorney, Agent, or Firm* — Foley & Lardner LLP

(57) ABSTRACT

A method of fabricating a semiconductor device includes recessing an upper portion of a first dielectric layer disposed over a conductive feature. The method includes filling the recessed upper portion with a second dielectric layer to form a void embedded in the second dielectric layer. The method includes etching the second dielectric layer and the first dielectric layer to form a contact opening that exposes at least a portion of the conductive feature using the void to vertically align at least a lower portion of the contact opening with the conductive feature. The method includes filling the contact opening with a conductive material to form a contact feature electrically coupled to the conductive feature.

20 Claims, 17 Drawing Sheets

(51) Int. Cl.
  *H01L 23/522*   (2006.01)
  *H01L 29/40*    (2006.01)
  *H01L 29/417*   (2006.01)

(56) References Cited

U.S. PATENT DOCUMENTS

| | | |
|---|---|---|
| 2019/0214296 A1 | 7/2019 | Wang et al. |
| 2020/0006127 A1 | 1/2020 | Khaderbad et al. |
| 2020/0126987 A1 | 4/2020 | Rubin et al. |
| 2021/0407895 A1 | 12/2021 | Lin et al. |

* cited by examiner

CONTACT FEATURES OF SEMICONDUCTOR DEVICES

CROSS-REFERENCE TO RELATED APPLICATIONS

The present application is a divisional of U.S. Non-Provisional patent application Ser. No. 17/192,600, filed on Mar. 4, 2021, and titled "Contact Features of Semiconductor Devices," the entire disclosure of which is incorporated herein by reference.

BACKGROUND

The present disclosure generally relates to semiconductor devices, and particularly to contact features of semiconductor devices.

The semiconductor industry has made significant advancements in its pursuit of higher device density with lower cost. In the course of semiconductor device evolution, functional density (for example, the number of interconnected conductive features per chip area) has generally increased, while geometry sizes have decreased. This scaling down process generally provides benefits by increasing production efficiency and lowering associated costs. However, the increased functional density has increased the complexity of semiconductor devices, for example, by decreasing the distance between adjacent conductive features. When the distance between the adjacent conductive features decreases, it can be challenging to form a contact feature for each of the conductive features. For example, a distance between the contact features generally decreases in accordance with the decreased distance between the adjacent conductive features, which can significantly increase the possibility of shorting the contact features.

Therefore, there is a need for an improved contact feature, and a method of forming the same.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

Figure 1:
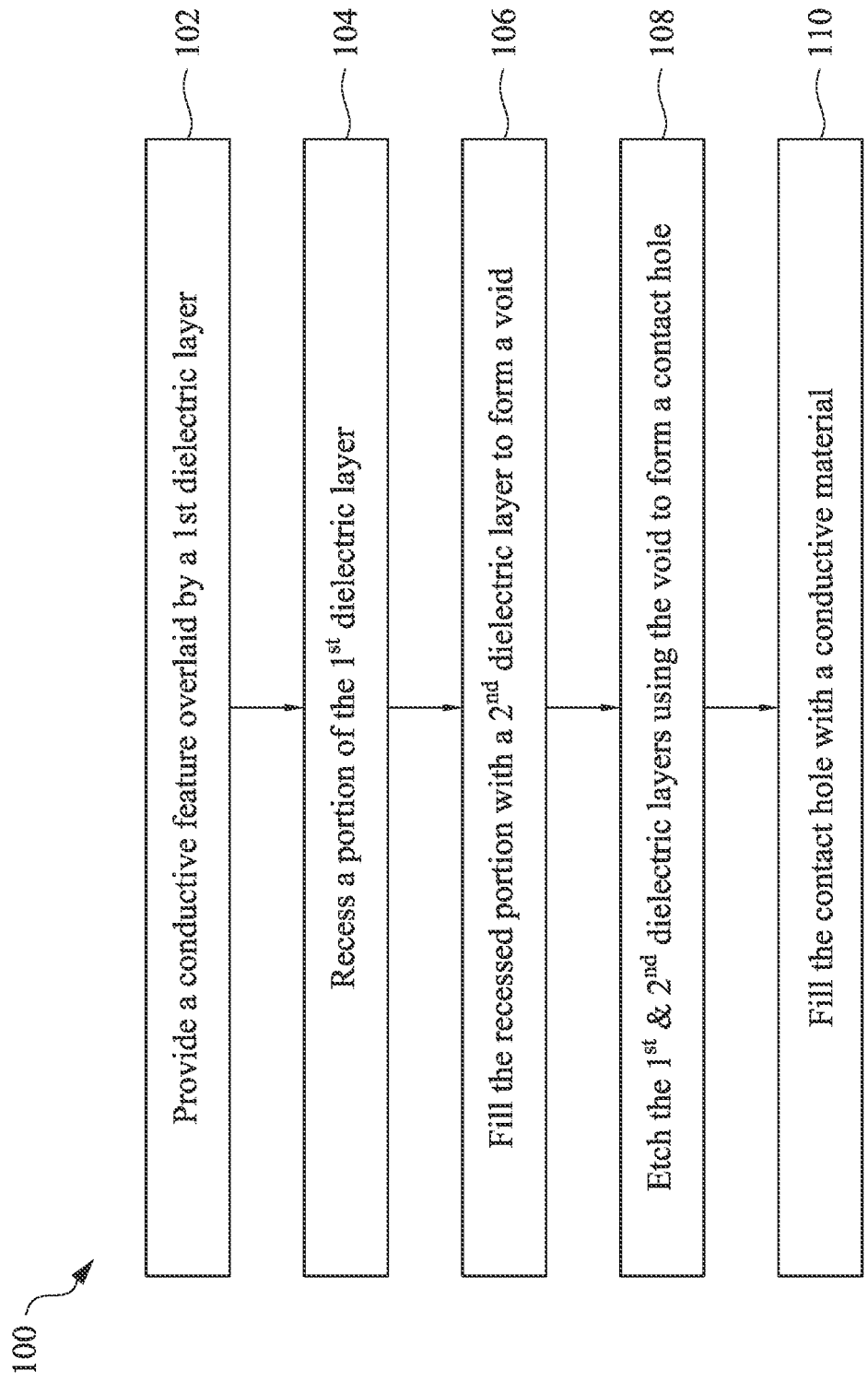
FIG. 1 illustrates a flow chart of an example method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device including at least one contact feature that is formed through a void. Using the void, the contact feature can be characterized with a size beyond (e.g., smaller) the limit of a patterning process (e.g., a photolithography process). As such, when forming respective contact features for conductive features that are laterally spaced apart from each other by a relatively small distance, the contact features can still be successfully formed without any issue (e.g., shorting the conductive features). For example, a void may be formed in a dielectric layer by adjusting conditions for depositing the dielectric layer. The void can be formed by intentionally forming an overhang of the dielectric layer over a recess with a relatively large size, which may be limited by a certain patterning process. Accordingly, the void can be characterized with a size substantially less than the size of the recess. A contact hole can be formed to be self-aligned with the void, which can also inherit a size substantially similar with the size of the void. Accordingly, by filling the contact hole with a conductive material, a contact feature, characterized with a size beyond the limit of pattering processes, can be formed.

FIG. 1 is a flowchart illustrating a method 100 for fabricating a semiconductor device 200, according to various aspects of the present disclosure. It is noted that the method 100 is merely an example, and is not intended to limit the present disclosure. Accordingly, it is understood that additional operations may be provided before, during, and after the method 100 of FIG. 1, and that some other operations may only be briefly described herein. In some embodiments, operations of the method 100 may be associated with cross-sectional views of a semiconductor device at various fabrication stages as shown in FIGS. 1, 2, 3, 4, 5, 6, and 7, respectively, which will be discussed in further detail below.

Referring now to FIG. 1, the method 100 begins at operation 102 in which a conductive feature overlaid by a first dielectric layer is provided. The method 100 proceeds to operation 104 in which a portion of the first dielectric layer is recessed. The method 100 proceeds to operation 106 in which a void is formed by filling the recessed portion with a second dielectric layer. The method 100 proceeds to operation 108 in which a contact hole is formed by etching the first and second dielectric layers through the void. The method 100 proceeds to operation 110 in which a contact feature is formed by filling the contact hole with a conductive material.

As mentioned above, FIGS. 2, 3, 4, 5, 6, and 7 show schematic cross-sectional views of the semiconductor device 200 at various stages of fabrication according to an embodiment of the method 100 of FIG. 1. The semiconductor device 200 may be included in a microprocessor, memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 7 are simplified for a better understanding of the present disclosure. For example, although the figures illustrate the semiconductor device 200, it is understood the IC may comprise a number of other devices comprising transistors, resistors, capacitors, inductors, fuses, etc.

Figure 2:
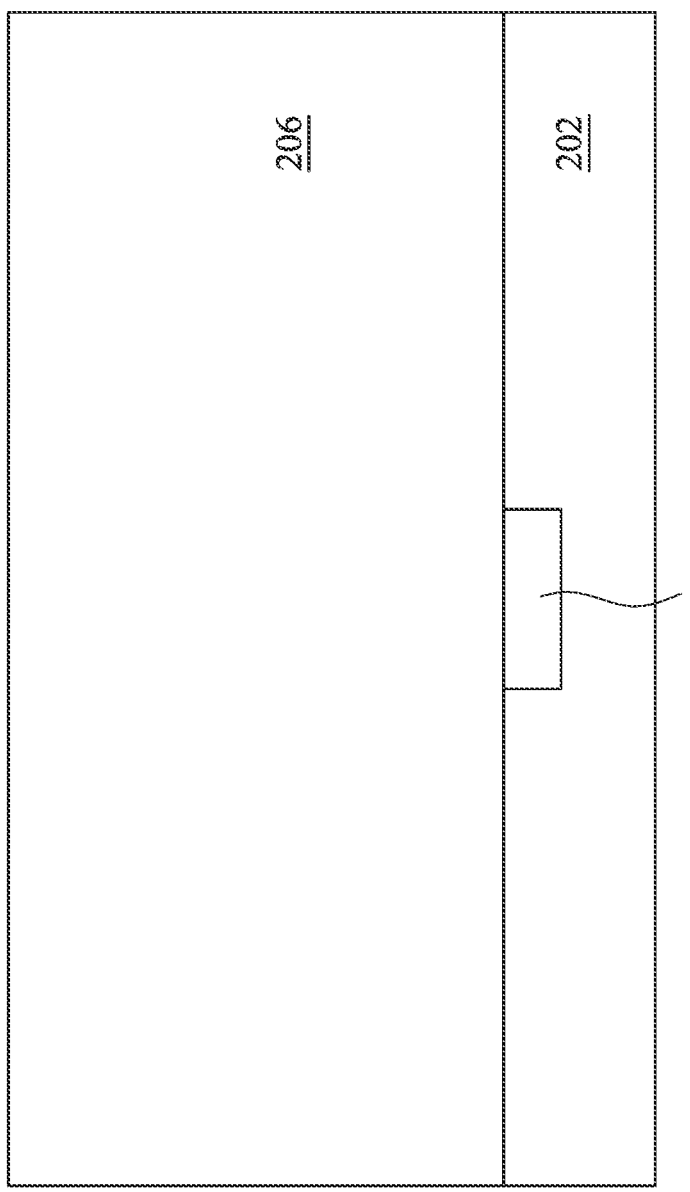
FIGS. 2, 3, 4, 5, 6, and 7 illustrate cross-sectional views of an example semiconductor device during various fabrication stages, made by the method of FIG. 1, in accordance with some embodiments.

Corresponding to operation 102 of FIG. 1, FIG. 2 is a cross-sectional view of the semiconductor device 200 including a substrate 202 with at least one conductive feature 204, that is overlaid by a first dielectric layer 206, at one of the various stages of fabrication, in accordance with some embodiments. Although the semiconductor device 200 in the illustrated embodiment of FIG. 2 includes only one conductive feature 204, it is understood that the illustrated embodiment of FIG. 2 and the following figures are merely provided for illustration purposes. Thus, the semiconductor device 200 may include any desired number of conductive features while remaining within the scope of the present disclosure. For example, on each of the sides of the conductive feature 204, the semiconductor device 200 can include at least one conductive feature substantially closed to the conductive feature 204.

The semiconductor substrate 202 includes a semiconductor material substrate, for example, silicon. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In the above-described embodiment where the substrate 202 includes a semiconductor material, the conductive feature 204 may be a source feature (e.g., a source electrode), a drain feature (e.g., a drain electrode), or a gate feature (e.g., a gate electrode) of a transistor (e.g., a metal-oxide-semiconductor-field-effect-transistor (MOSFET)). Alternatively, the conductive feature 204 may be a salicide feature disposed on the source, the drain or the gate electrode. The salicide feature may be formed by a self-aligned silicide (typically known as "salicide") technique.

In some other embodiments, the substrate 202 is a dielectric material substrate formed over various device features (e.g., a source, drain, or gate electrode of a transistor). Such a dielectric material substrate 202 may include at least one of: silicon oxide, a comparatively low dielectric constant (k value) dielectric material with a k value less than about 4.0, or combinations thereof. In some embodiments, the dielectric material substrate 202 is formed of a material, including a low-k dielectric material, an extreme low-k dielectric material, a porous low-k dielectric material, or combinations thereof. The term "low-k" is intended to define a dielectric constant of a dielectric material of 3.0 or less. The term "extreme low-k (ELK)" refers to a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed by some embodiments of the present disclosure such as, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material.

In such an embodiment where the substrate 202 is formed of a dielectric material, the conductive feature 204 may be a horizontal conductive structure, a vertical conductive structure, or combinations thereof formed within the substrate 202. For example, the conductive feature 204 may be an interconnection structure (e.g., a horizontal conductive structure), a via structure (e.g., a vertical conductive structure), or combinations thereof. Accordingly, the conductive feature 204 may be electrically coupled to a device feature of a transistor, for example, a source, drain, or gate feature of the transistor that is disposed below the tier, the interconnect level, or the metallization layer. In such embodiments, the conductive feature 204 may be formed of a metal material (e.g., copper (Cu), aluminum (Al), tungsten (W), etc.).

The first dielectric layer 206 is a dielectric material formed overlaying various conductive features (e.g., 204 and the like). The first dielectric layer 206 may include at least one of: silicon oxide, a comparatively low dielectric constant (kvalue) dielectric material with a kvalue less than about 4.0, or combinations thereof. In some embodiments, the first dielectric layer 206 is formed of a material, including a low-k dielectric material, an extreme low-k dielectric material, a porous low-k dielectric material, or combinations thereof. The term "low-k" is intended to define a dielectric constant of a dielectric material of 3.0 or less. The term "extreme low-k (ELK)" refers to a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed by some embodiments of the present disclosure such as, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material.

Figure 3:
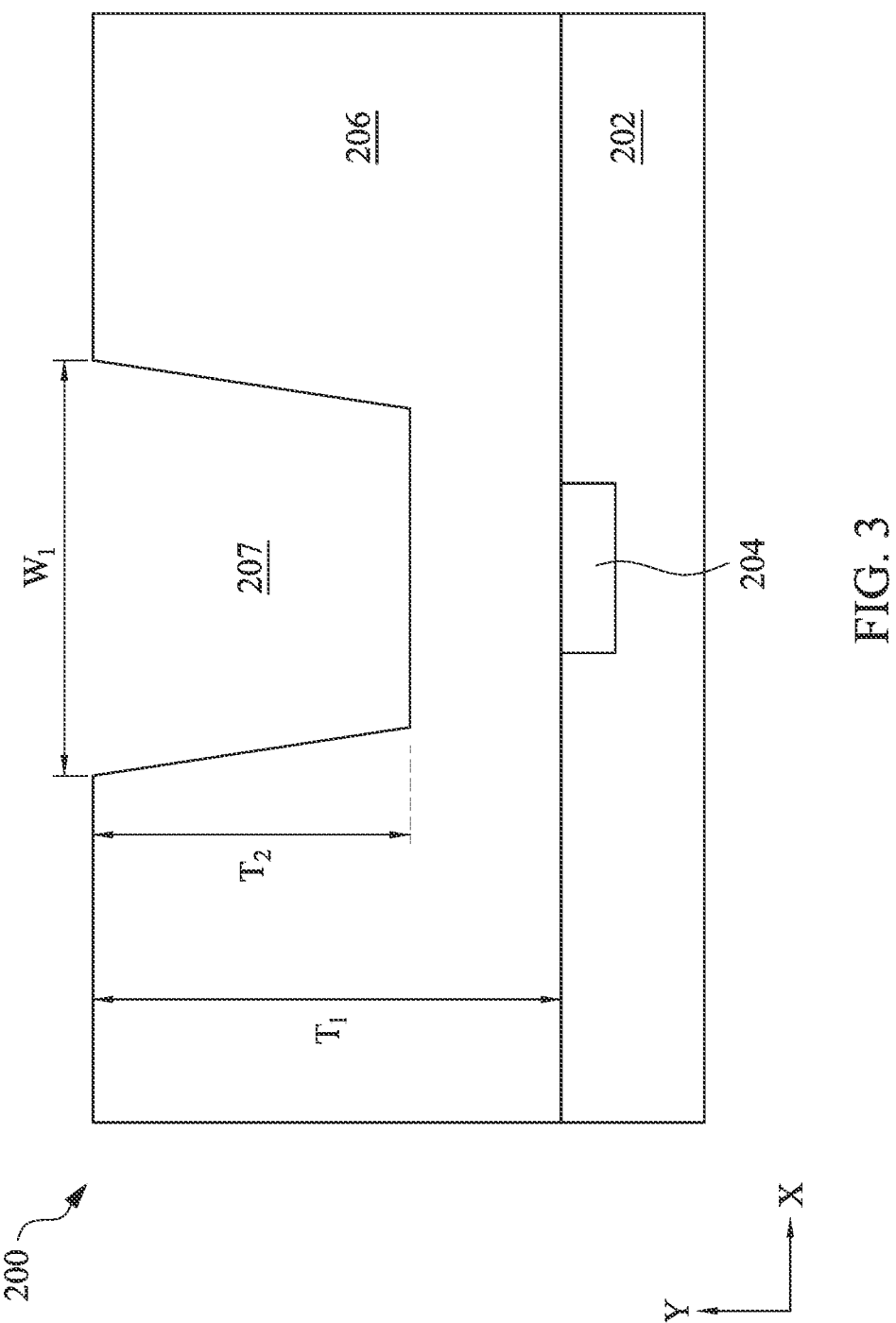

Corresponding to operation 104 of FIG. 1, FIG. 3 is a cross-sectional view of the semiconductor device 200 in which a portion of the first dielectric layer 206 is recessed (hereinafter "recessed portion 207"). The recessed portion 207 may be formed using a lithography with masking technologies and one or more dry etching operations, e.g. plasma etching or reactive ion etching. Alternatively or additionally, the recessed portion 207 may be formed using one or more wet etching operations. The recessed portion 207 is formed to be vertically aligned with the conductive feature 204.

In some embodiments, in a first direction (e.g., the Y direction) along which the first dielectric layer 206 is disposed with respect to the substrate 202, the recessed portion 207 may partially extend through the first dielectric layer 206. Specifically, the first dielectric layer 206 may be formed to be characterized with a thickness T1 and the recessed portion 207 may extend into the first dielectric layer 206 by a depth T2, wherein T2 is substantially less than T1. For example, the thickness T1 can range from about 150 nanometers (nm) to about 180 nm, while the depth T2 can range from about 120 nm to about 150 nm. In some embodiments, in a second direction (e.g., the X direction) intersecting the first direction, the recessed portion 207 may be characterized with a width (or a cross-sectional length) W1, as shown in FIG. 3. Such a width W1 may be associated with (e.g., defined by) the critical dimension of a certain patterning process (e.g., a lithography process) to form the recessed portion 207. For example, the width W1 can range from 30 nm to 80 nm. The recessed portion 207 can be formed as gradually tapering from a top surface of the first dielectric layer 206 toward the substrate 202. The recessed portion 207 is not necessarily to be formed with a substantially small dimension (e.g., W1). As such, the cost and/or resources (e.g., the number of photoresist layers in the lithography process) to form the recessed portion 207 can be significantly reduced. In accordance with some embodiments, the recessed portion 207 may present an aspect ratio (T2/W1) greater than 1.5 to facilitate the formation of a void. Details of the void shall be discussed below.

Figure 4:
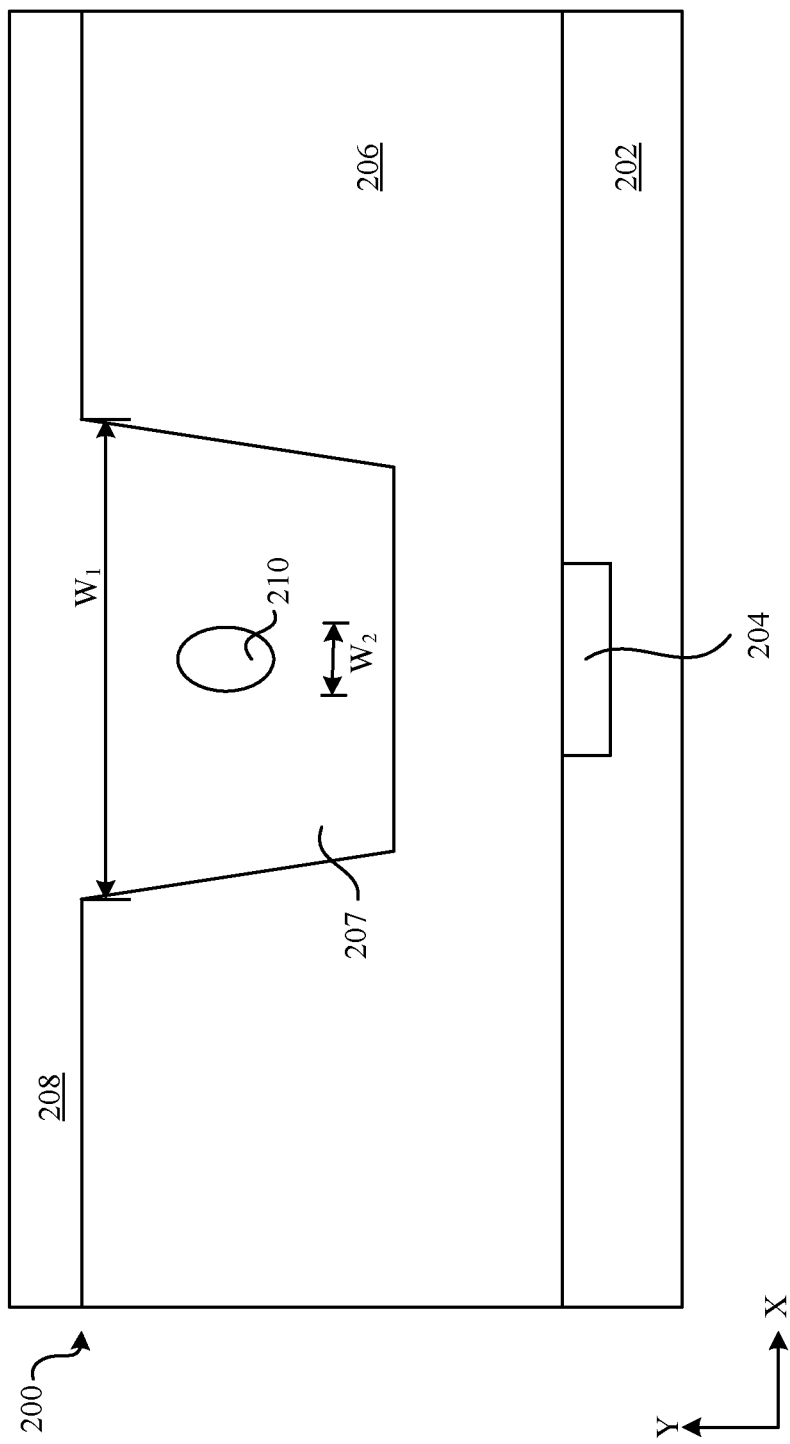

Corresponding to operation 106 of FIG. 1, FIG. 4 is a cross-sectional view of the semiconductor device 200 including a void 210 formed in a second dielectric layer 208. The void 210 is formed concurrently with forming the second dielectric layer 208, which shall be discussed in further detail below. The void 210 is formed to be vertically aligned with the conductive feature 204. In some embodiments, the void 210 is characterized with a width (or a cross-sectional length) W2, along the X direction, that is substantially smaller than the width W1 of the recessed portion 207. For example, the width W2 may be ⅓ or less of the width W1. In another example, the width W2 may be ½ or less of the width W1. As such, the void 210 can be later used to form a contact feature that inherits the void 210's width W2 and is self-aligned with the conductive feature 204. In this way, a critical dimension of such a contact feature can be further reduced beyond the limit of a photolithography process.

In one embodiment, the second dielectric layer 208 is formed using a suitable deposition process (e.g., chemical vapor deposition, physical vapor deposition, etc.), wherein the deposition process is tuned such that the dimensions of the recessed portion 207 and the deposition rate are such that the deposition process shall not completely fill the recessed portion 207 but, rather, shall form the desired void 210 in the second dielectric layer 208. As a non-limiting example, when the aspect ratio of the recessed portion 207 as described above with respect to FIG. 3, and in which silicon oxide (an example material of the second dielectric layer 208) is deposited, the deposition process may be begun by introducing precursor materials such as silane ($SiH_4$) and oxygen ($O_2$) to the first dielectric layer 206. In an embodiment the silane is introduced at a flow rate of between about 100 sccm and about 10000 sccm, such as about 2000 sccm, while the oxygen is introduced at a flow rate of between about 500 sccm and about 10000 sccm, such as about 4000 sccm. Further, the deposition may be performed at a temperature of between about 200° C. and about 500° C., such as about 400° C., and a pressure of between about 0.1 Torr and about 10 Torr, such as about 3 Torr.

By utilizing these process parameters, the second dielectric layer 208 shall be deposited with a relatively high rate of deposition, such as a rate of deposition of between about 1 nm/s and about 10 nm/s, such as about 3 nm/s. With such a rate of deposition, and with the dimensions of the recessed portion 207 as described above, the void 210 can be formed in the second dielectric layer 208. In some other embodiments, the second dielectric layer 208 can include any of other suitable dielectric materials such as, for example, silicon nitride, silicon carbide, silicon oxynitride, polysilicon, or combinations thereof, while remaining within the scope of the present disclosure. According to various embodiments of the present disclosure, the first dielectric layer 206 and the second dielectric layer 208 may include similar or different dielectric materials, as long as those two dielectric materials are respectively characterized with different etching characteristics (e.g., different etching rates to a certain etchant).

Figure 5:
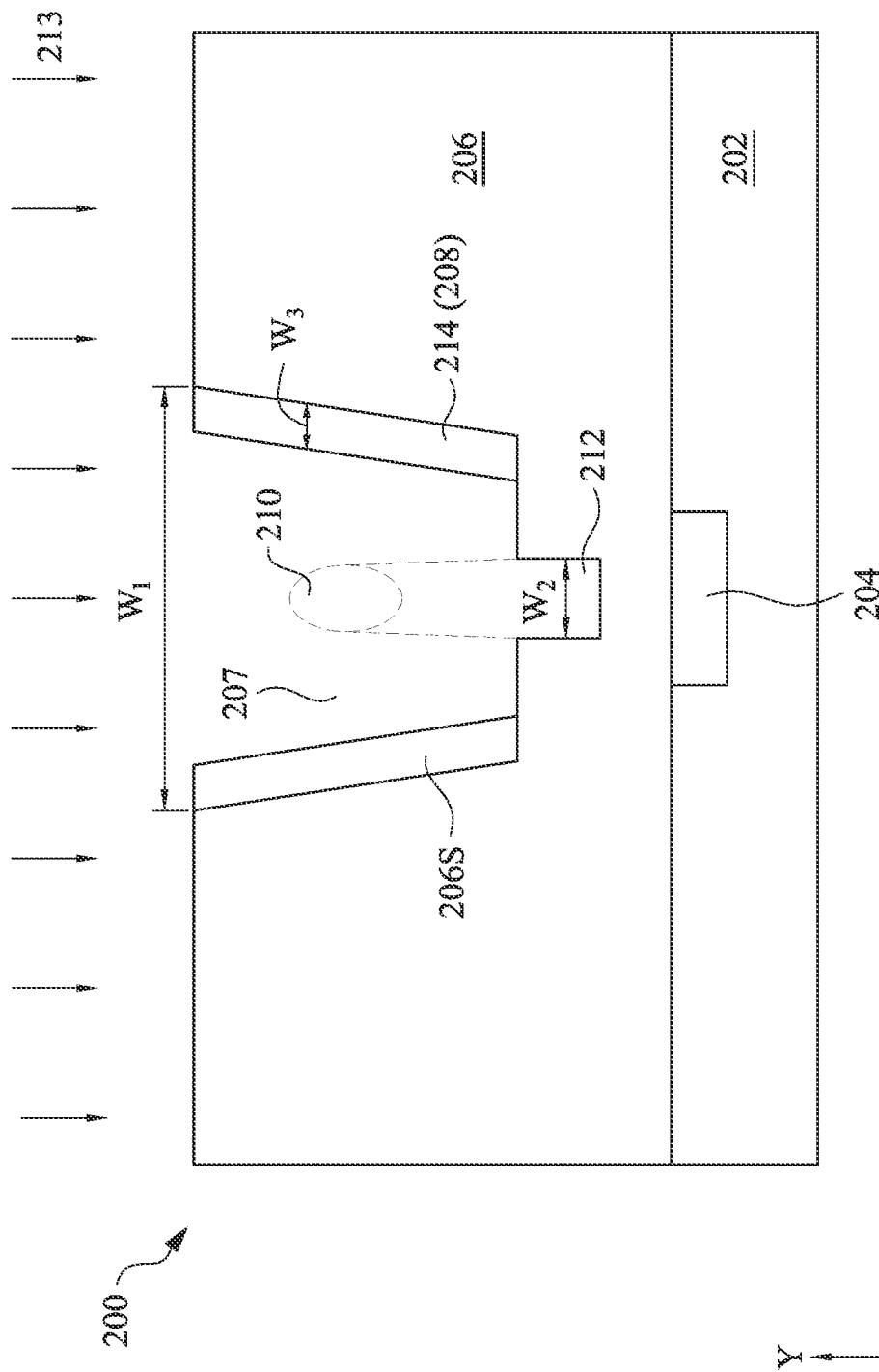
Figure 7:
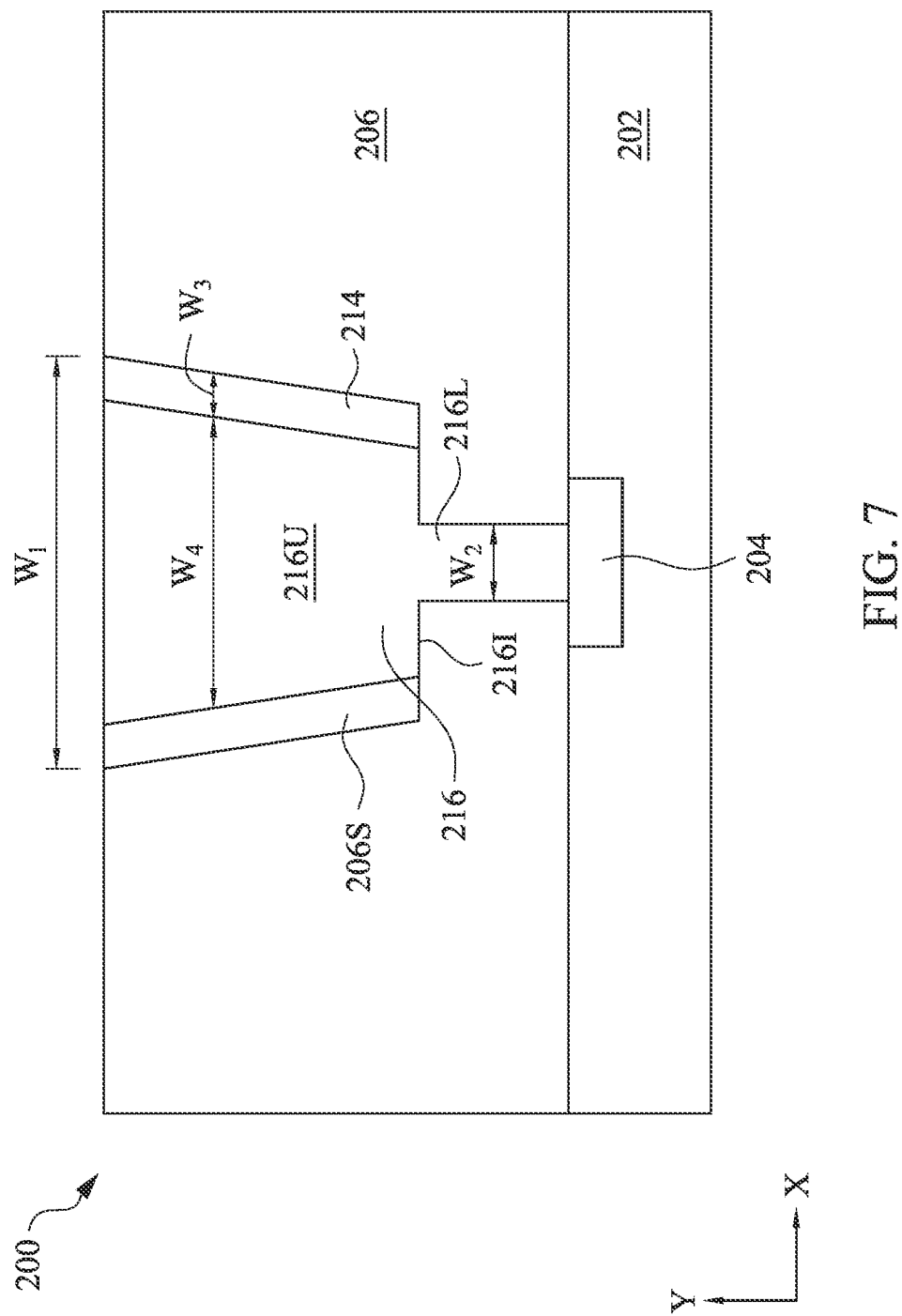

Corresponding to operation 108 of FIG. 1, FIG. 5 is a cross-sectional view of the semiconductor device 200 in which a contact hole 212 is formed. In some embodiments, the contact hole 212 may be formed by performing an etching process 213 on the second dielectric layer 208 (FIG. 4) and the first dielectric layer 206. The etching process 213 may be an anisotropic or directional etching process, in which the etchants (e.g., particles, ions, plasma) may be directed along a certain direction (e.g., the Y direction). As mentioned above, the first dielectric layer 206 and the second dielectric layer 208 are characterized with respective different etching rates. Accordingly, a portion of the second dielectric layer 208 (hereinafter "spacer layer 214") may remain with a thickness W3, as shown in FIG. 7. The spacer layer 214 may extend along an upper portion of an inner sidewall 206S of the first dielectric layer 206. As shall be discussed below, the spacer layer 214 can protect one or more other conductive features in the first dielectric layer 206 and/or over the substrate 202 from being damaged, when filling the contact hole 212 (and the recessed portion 207) with a conductive material.

Figure 6:
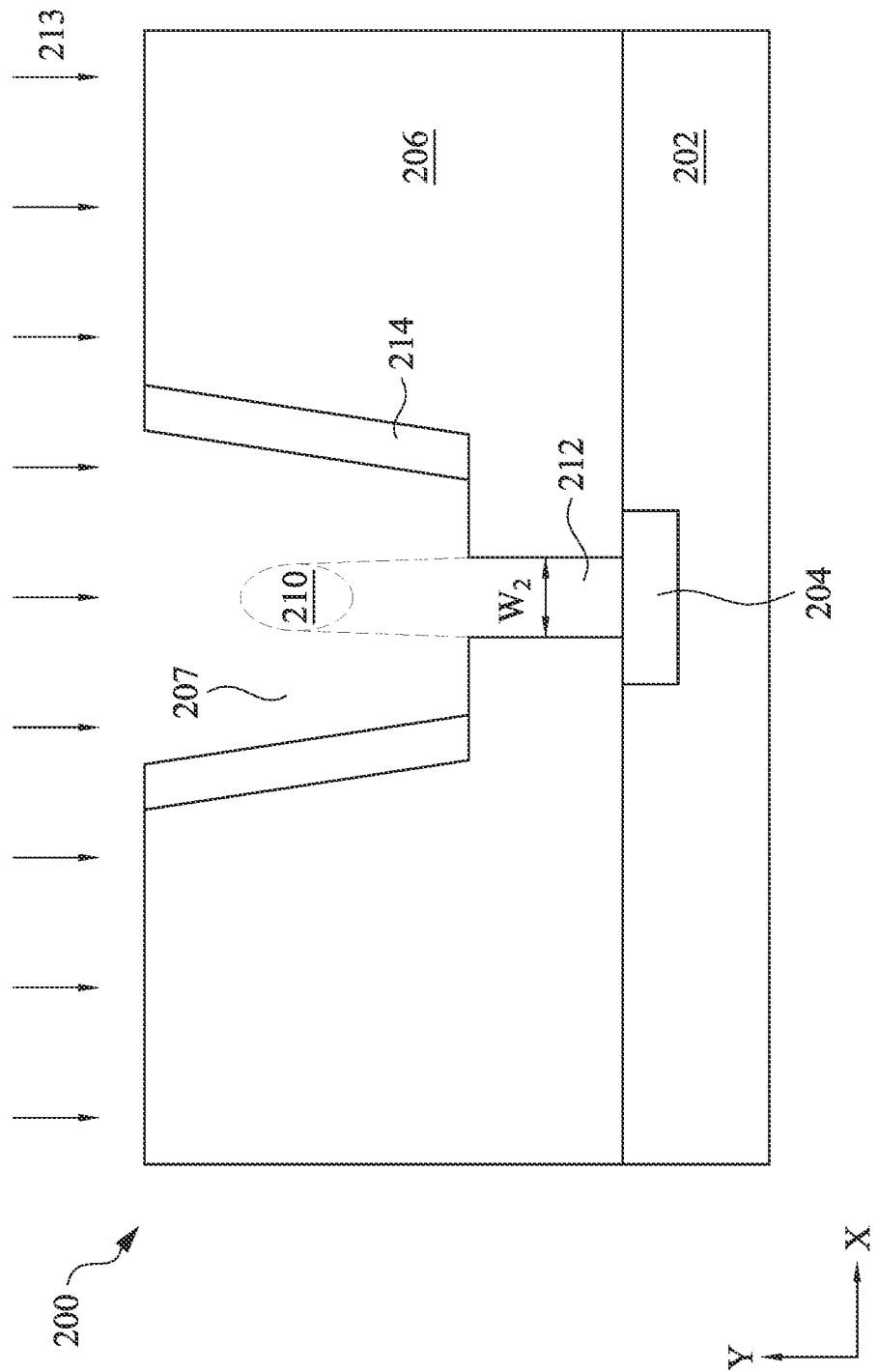

Further, in accordance with various embodiments, while etching the second dielectric layer 208, the void 210 can facilitate the etchant of the etching process 213, which is directed to be substantially parallel with the direction along which the void 210 is extended (e.g., the Y direction), to remove a portion of the second dielectric layer 208 directly beneath the void 210, and then a portion of the first dielectric layer 206 also directly beneath the void 210, thereby forming the contact hole 212. In this way, the contact hole 212 can be "self-aligned" with the void 210, which causes the contact hole 212 to inherit the width, W2, of the void 210. Unlike exiting technologies which typically requires additional cost and/or resources to reduce the critical dimension of the recessed portion 207 (with respect to the discussion of FIG. 3), the contact hole 212 can be formed with a dimension substantially less than the width W1 of the recessed portion 207 (FIG. 3) or beyond the limit of the lithographic process. Alternatively or additionally, the etching process 213 can include one or more etching processes, each of which has similar or different etching conditions, that causes the contact hole 212 to etch through the portion of the first dielectric layer 206 beneath the void 210, as shown in FIG. 6. As such, at least a portion of an upper surface of the conductive feature 204 may be exposed.

Corresponding to operation 110 of FIG. 1, FIG. 7 is a cross-sectional view of the semiconductor device 200 including a contact feature 216. The contact feature 216 may be formed by filling the contact hole 212 (FIGS. 5-6) with a conductive material, followed a polishing process (e.g., a chemical mechanical polishing (CMP) process). The conductive material can include a metal material such as, for example, copper (Cu), aluminum (Al), tungsten (W), or combinations thereof.

As shown, in some embodiments, the contact feature 216 includes an upper portion 216U and a lower portion 216L. The upper portion 216U is laterally spaced from (or surrounded by) the upper portion of the inner sidewall 206S of the first dielectric layer 206 by the spacer layer 214. As such, the upper portion 216U can present a width (or a cross-sectional length), W4, that can be equal to: W1-2W3. By contrast, the lower portion 216L, formed through the void 210, is in contact with a lower portion of the inner sidewall 206S of the first dielectric layer 206. As such, the lower portion 216L can inherit the width of the void 210, W2, which is about ⅓ or less of the width W1. In some embodiments, width W2 may be about ½ or less of the width W1. Given the different dimensions of the upper portion and the lower portion of the contact feature 216, the contact feature 216 can include (or otherwise define) an intermediate boundary 216I at the intersection of the upper portion 216U and the lower portion 216L. In some embodiments, the intermediate boundary 216I may be substantially parallel with the X direction.

By using the void 210 to form the contact hole 212 (FIGS. 5-6), the critical dimension of the lower portion 216L of the contact feature 216 (e.g., W2) can be formed to be substantially less than the width W1, which may sometimes be limited by the lithographic process. Further, by extending the inner sidewall 206S of the first dielectric layer 206 with the spacer layer 214, a number of contact features (some of which may be similar to the contact feature 216) can be formed relatively close to each other, as the spacer layer 214 may serve as an additional protection layer (relative to the first dielectric layer 206) to electrically isolate adjacent ones of the contact features.

Figure 8A:
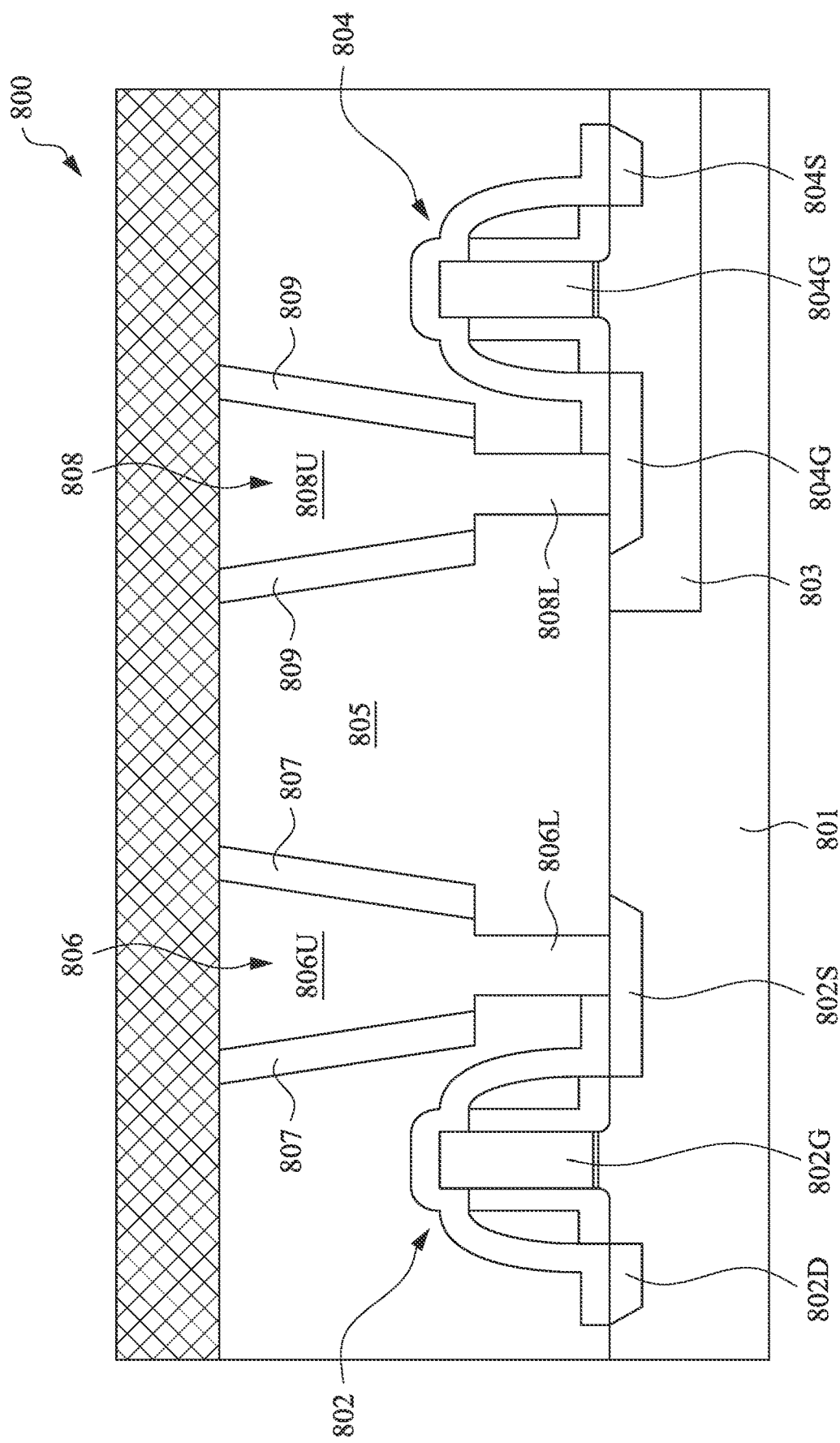
FIG. 8A illustrates an example semiconductor device including one or more contact features, made by the method of FIG. 1, in accordance with some embodiments.
Figure 8B:
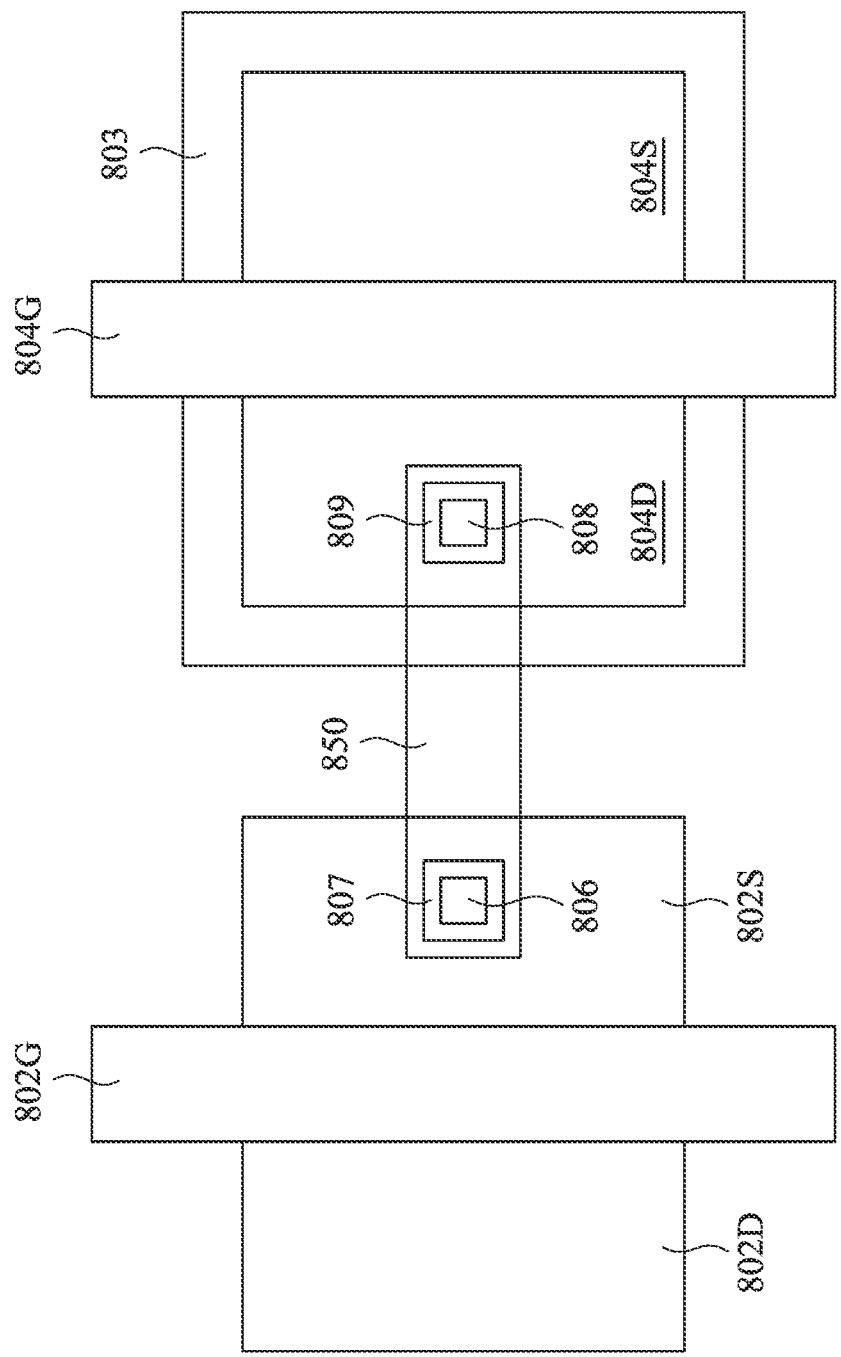
FIG. 8B illustrates a corresponding top view of the semiconductor device of FIG. 8A, in accordance with some embodiments.

FIGS. 8A and 8B respectively illustrate a cross-sectional view and a top view of an example semiconductor device 800 that includes at least one of the contact features, as disclosed herein. As shown in FIG. 8A, the semiconductor device 800 includes two transistors 802 and 804 formed on a substrate 801. The transistor 802 includes a gate feature (or electrode) 802G, a drain feature 802D, and a source feature 802S; and the transistor 804, formed in a well 803 of the substrate 801, includes a gate feature (or electrode) 804G, a drain feature 804D, and a source feature 804S. In the example where the substrate 801 is p-type doped, the well 803 may be n-type doped. As such, the transistor 802 may be an n-type transistor, and the transistor 804 may be a p-type transistor. Although the transistors 802 and 804 are shown as planar transistors in the illustrated embodiment of FIG. 8A, it is understood that each of the transistors can include any of other types of transistors (e.g., FinFETs, nanowire transistors, nanosheet transistors) while remaining within the scope of the present disclosure.

In some cases, the gate features 802G and 804G may be formed to be substantially closed to each other. As such, to form contact feature(s), e.g., contact features 806 and 808, between such substantially close gate features, using the disclosed method can be beneficial. For example, although the respective dimensions of upper portion 806U of the contact feature 806 and upper portion 808U of the contact feature 808 may be limited by the lithographic process, lower portion 806L of the contact feature 806 and upper portion 808L of the contact feature 808 that actually connects to the conductive feature (e.g., 802S and 804D) can still be formed to have a dimension beyond (e.g., less than) the limit. Also, with spacer layers, 807 and 809, respectively separating the upper portion 806U and 808U from low-k dielectric layer 805, the spacer layers 807 and 809 can protect the gate features 802G and 804G from being damaged while forming the contact features 806 and 808.

FIG. 8B illustrates a corresponding top view of the semiconductor device 800. In some embodiments, FIG. 8B may be a layout design of the semiconductor device 800. As shown, each of the features shown in FIG. 8A may be formed according to a respective pattern of FIG. 8B. For example, a pattern to form the gate feature 802G may extend across a pattern to form the source/drain features 802S/802D; a pattern to form the gate feature 804G may extend across a pattern to form the source/drain features 804S/804D, which is surrounded by a pattern to form the well 803; and a pattern (e.g., 850) to form the contact features 806 and 808 may overlap a portion of the source feature 802S and a portion of the drain feature 804D. It should be noted that each of the contact features 806 and 808 can be surrounded by a respective spacer layer (e.g., 807 and 809), when viewed from the top.

Figure 9A:
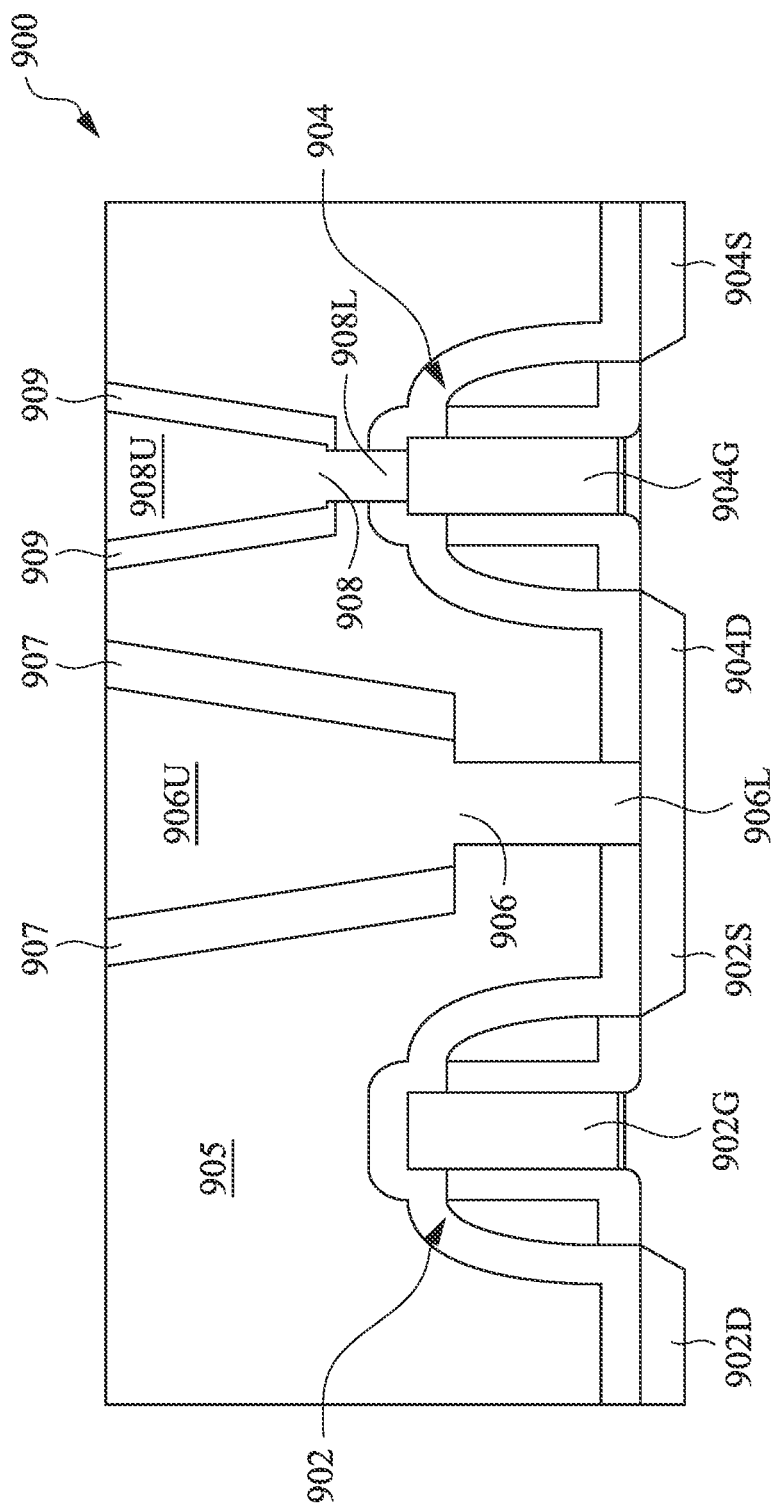
FIG. 9A illustrates another example semiconductor device including one or more contact features, made by the method of FIG. 1, in accordance with some embodiments.
Figure 9B:
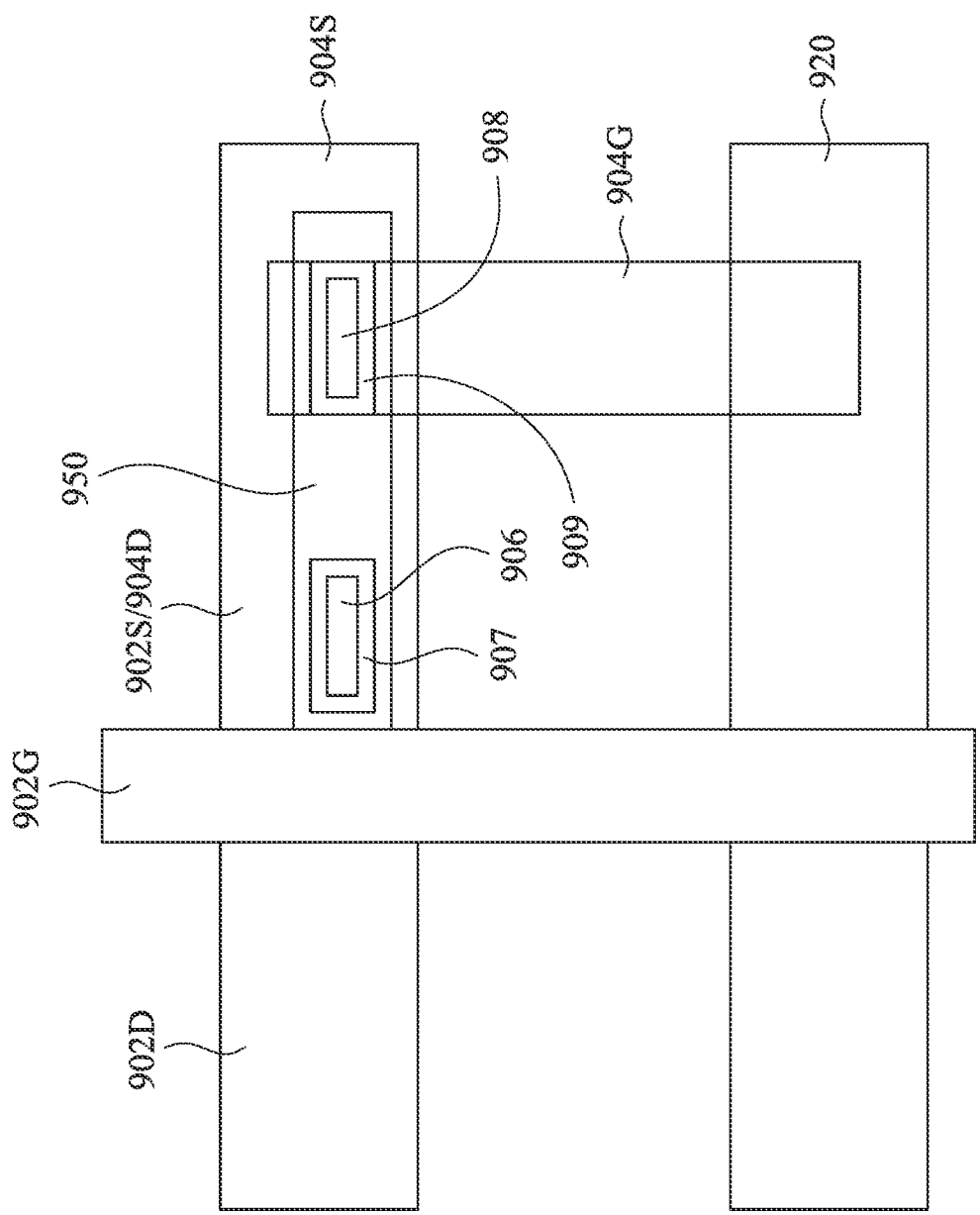
FIG. 9B illustrates a corresponding top view of the semiconductor device of FIG. 9A, in accordance with some embodiments.

FIGS. 9A and 9B respectively illustrate a cross-sectional view and a top view of another example semiconductor device 900 that includes at least one of the contact features, as disclosed herein. As shown in FIG. 9A, the semiconductor device 900 includes two transistors 902 and 904. The transistor 902 includes a gate feature (or electrode) 902G, a drain feature 902D, and a source feature 902S; and the transistor 904 includes a gate feature (or electrode) 904G, a drain feature 904D, and a source feature 904S. Although the transistors 902 and 904 are shown as planar transistors in the illustrated embodiment of FIG. 9A, it is understood that each of the transistors can include any of other types of transistors (e.g., FinFETs, nanowire transistors, nanosheet transistors) while remaining within the scope of the present disclosure. The semiconductor device 900 can include two contact features 906 and 908 that are electrically connected to 902S/904D and 904G, respectively. Each of the contact features 906 and 908 can include an upper portion and a lower portion. As shown, the contact feature 906 includes an upper portion 906U separated from low-k layer 905 with spacer layer 907 and a lower portion 906L electrically connected to 902S/904D; and the contact feature 908 includes an upper portion 908U separated from low-k layer 905 with spacer layer 909 and a lower portion 908L electrically connected to 904G.

FIG. 9B illustrates a corresponding top view of the semiconductor device 900. In some embodiments, FIG. 9B may be a layout design of the semiconductor device 900. As shown, each of the features shown in FIG. 9A may be formed according to a respective pattern of FIG. 9B. For example, a pattern to form the gate feature 902G may extend across a pattern to form the source/drain features 902D/902S/904D/904S and another pattern (e.g., 920) to from other source/drain features; a pattern to form the gate feature 904G may extend across the pattern to form the source/drain features 902D/902S/904D/904S and the pattern 920; and a pattern (e.g., 950) to form the contact features 906 and 908 may overlap a portion of the source/drain feature 902S/904D and a portion of the gate feature 904G. It should be noted that each of the contact features 906 and 908 can be surrounded by a respective spacer layer (e.g., 907 and 909), when viewed from the top.

Figure 10A:
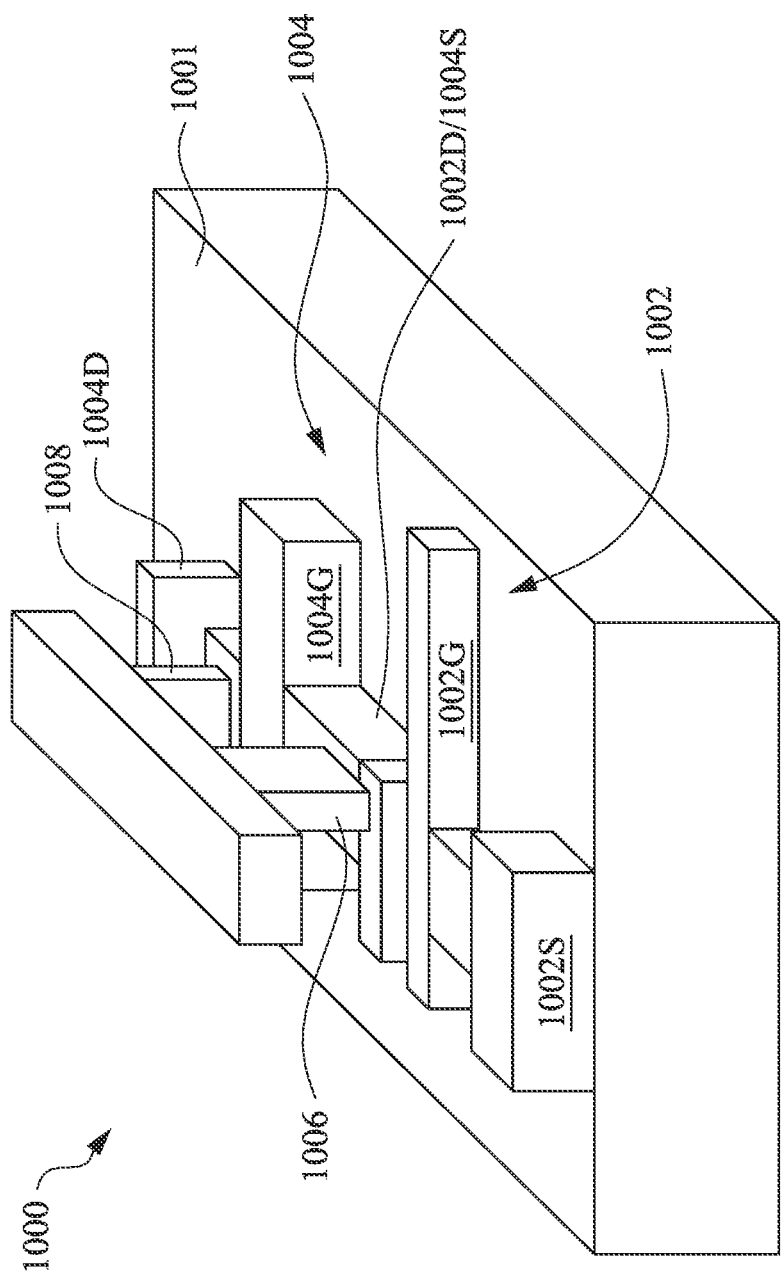
FIG. 10A illustrates yet another example semiconductor device including one or more contact features, made by the method of FIG. 1, in accordance with some embodiments.
Figure 10B:
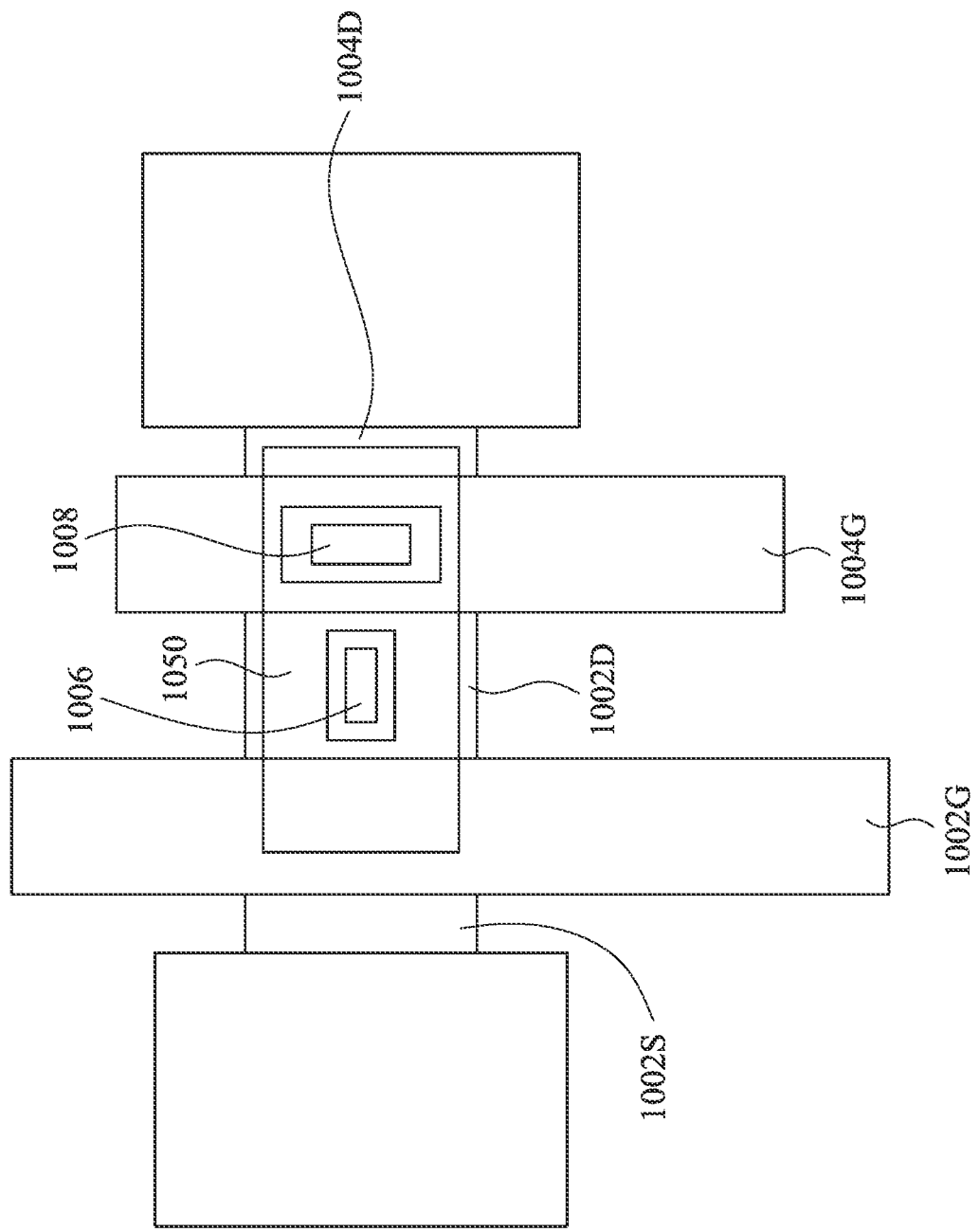
FIG. 10B illustrates a corresponding top view of the semiconductor device of FIG. 10A, in accordance with some embodiments.

FIGS. 10A and 10B respectively illustrate a perspective view and a top view of yet another example semiconductor device 1000 that includes at least one of the contact features, as disclosed herein. As shown in FIG. 10A, the semiconductor device 1000 includes two transistors 1002 and 1004 formed on a substrate 1001. The transistor 1002 includes a gate feature (or electrode) 1002G, a drain feature 1002D, and a source feature 1002S; and the transistor 1004 includes a gate feature (or electrode) 1004G, a drain feature 1004D, and a source feature 1004S. Although the transistors 1002 and 1004 are shown as fin field-effect-transistors (FinFETs) in the illustrated embodiment of FIG. 10A, it is understood that each of the transistors can include any of other types of non-planar transistors (e.g., nanowire transistors, nanosheet transistors) while remaining within the scope of the present disclosure. The semiconductor device 1000 can include two contact features 1006 and 1008 that are electrically connected to 1002D/1004S and 1004G, respectively. Each of the contact features 1006 and 1008 can include an upper portion and a lower portion, as shown above.

FIG. 10B illustrates a corresponding top view of the semiconductor device 1000. In some embodiments, FIG. 10B may be a layout design of the semiconductor device 1000. As shown, each of the features shown in FIG. 10A may be formed according to a respective pattern of FIG. 10B. For example, a pattern to form the gate feature 1002G may extend across a pattern to form the source/drain features 1002S/1002D/1004S/1004D; a pattern to form the gate feature 1004G may extend across the pattern to form the source/drain features 1002S/1002D/1004S/1004D; and a pattern (e.g., 1050) to form the contact features 1006 and 1008 may overlap a portion of the source/drain feature 1002D/1004S and a portion of the gate feature 1004G. It should be noted that each of the contact features 1006 and 1008 can be surrounded or lined by a respective spacer layer.

Figure 11A:
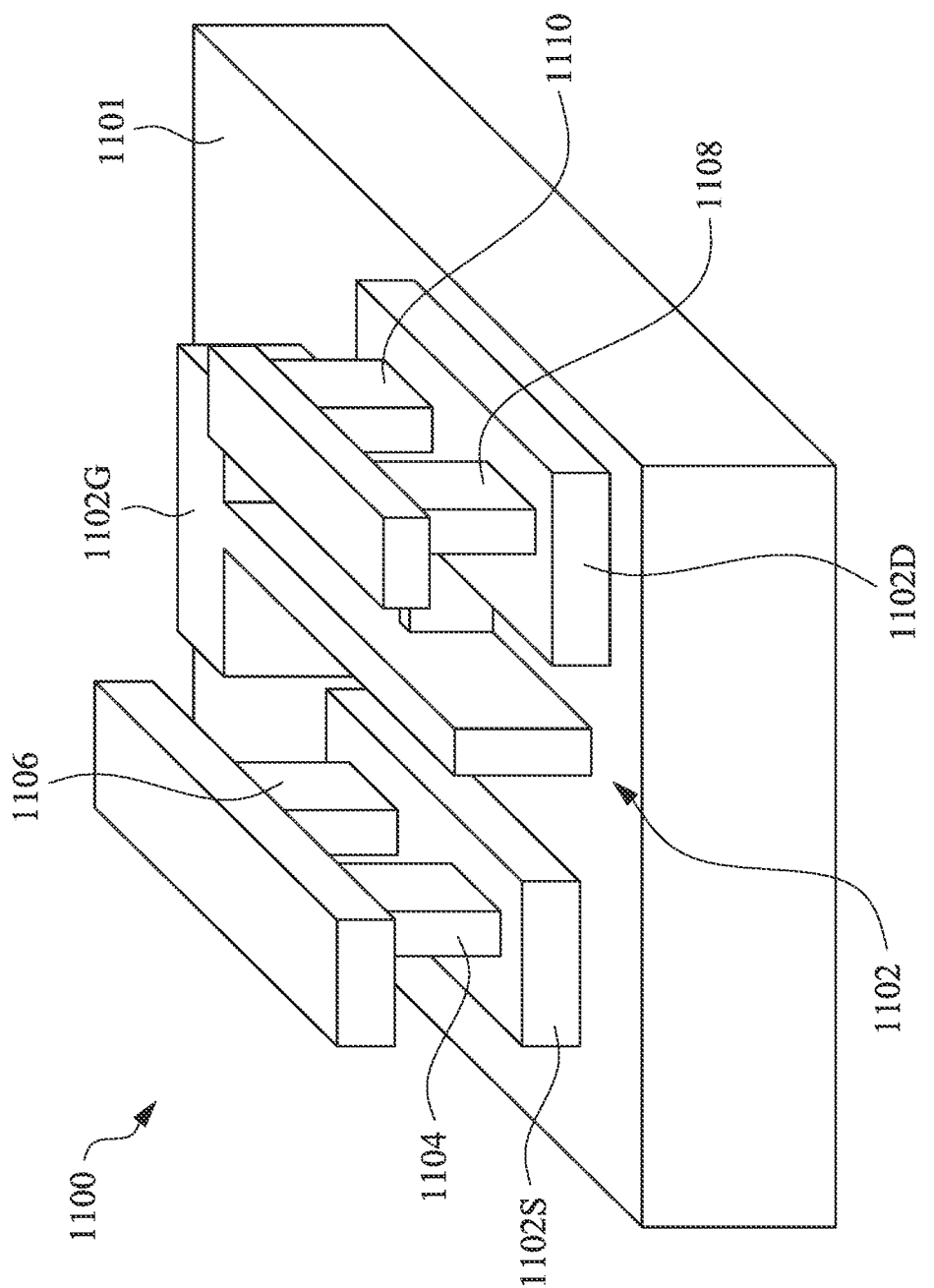
FIG. 11A illustrates yet another example semiconductor device including one or more contact features, made by the method of FIG. 1, in accordance with some embodiments.
Figure 11B:
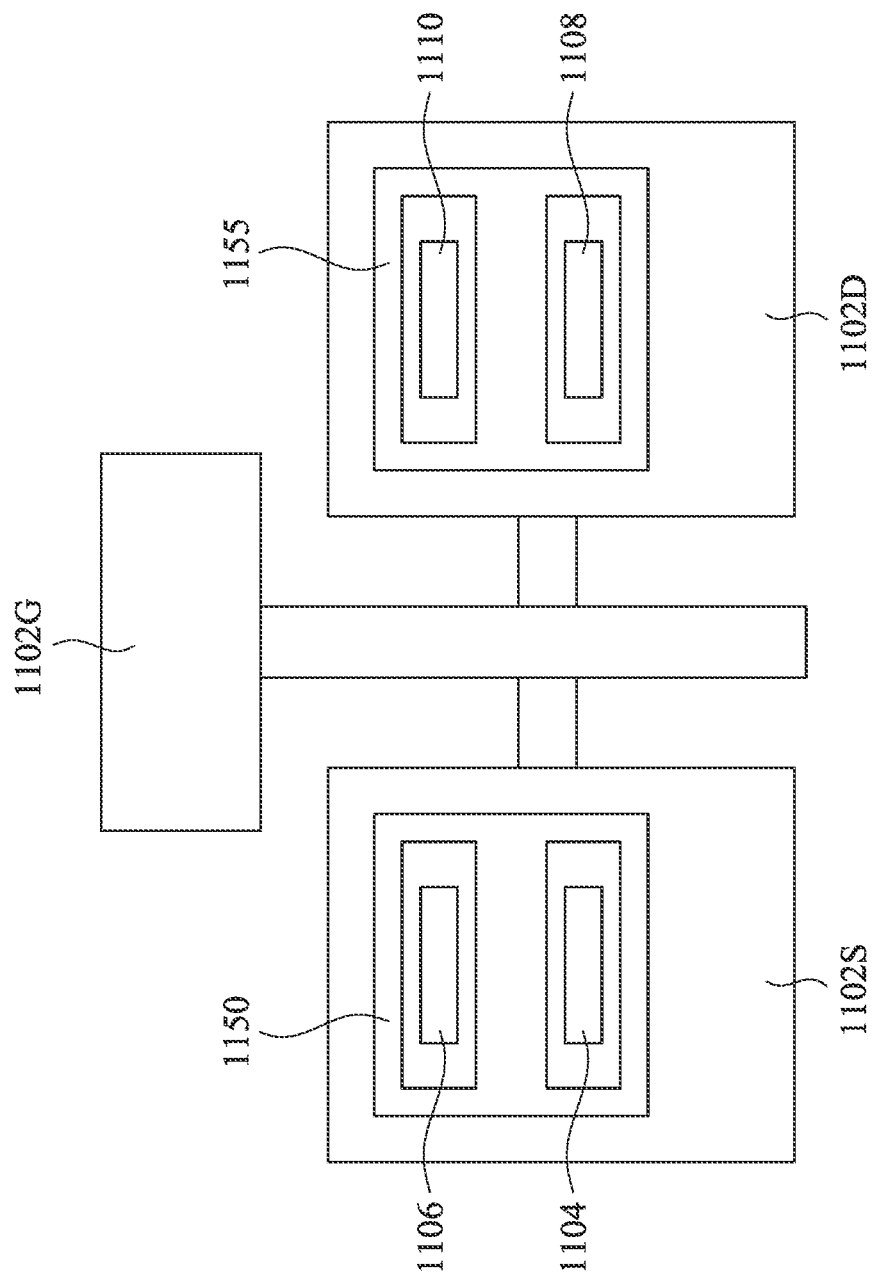
FIG. 11B illustrates a corresponding top view of the semiconductor device of FIG. 11A, in accordance with some embodiments.

FIGS. 11A and 11B respectively illustrate a perspective view and a top view of yet another example semiconductor device 1100 that includes at least one of the contact features, as disclosed herein. As shown in FIG. 11A, the semiconductor device 1100 includes a transistor 1102 formed on a substrate 1101. The transistor 1102 includes a gate feature (or electrode) 1102G, a drain feature 1102D, and a source feature 1102S. Although the transistors 1102 is shown as a fin field-effect-transistor (FinFET) in the illustrated embodiment of FIG. 11A, it is understood that the transistor can include any of other types of non-planar transistors (e.g., a nanowire transistor, a nanosheet transistor) while remaining within the scope of the present disclosure. The semiconductor device 1100 can include four contact features 1104, 1106, 1108, and 1110, wherein the contact features 1104 and 1106 are electrically connected to 1102S and the contact features 1108 and 1110 are electrically connected to 1102D. Each of the contact features 1104-1110 can include an upper portion and a lower portion, as shown above.

FIG. 11B illustrates a corresponding top view of the semiconductor device 1100. In some embodiments, FIG. 11B may be a layout design of the semiconductor device 1100. As shown, each of the features shown in FIG. 11A may be formed according to a respective pattern of FIG. 11B. For example, a pattern to form the gate feature 1102G may extend across a pattern to form the source/drain features 1102S/1102D; a pattern (e.g., 1150) to form the contact features 1104 and 1106 may overlap a portion of the source feature 1102S; and a pattern (e.g., 1155) to form the contact features 1108 and 1110 may overlap a portion of the drain feature 1102D. It should be noted that each of the contact features 1104-1110 can be surrounded or lined by a respective spacer layer.

Figure 12:
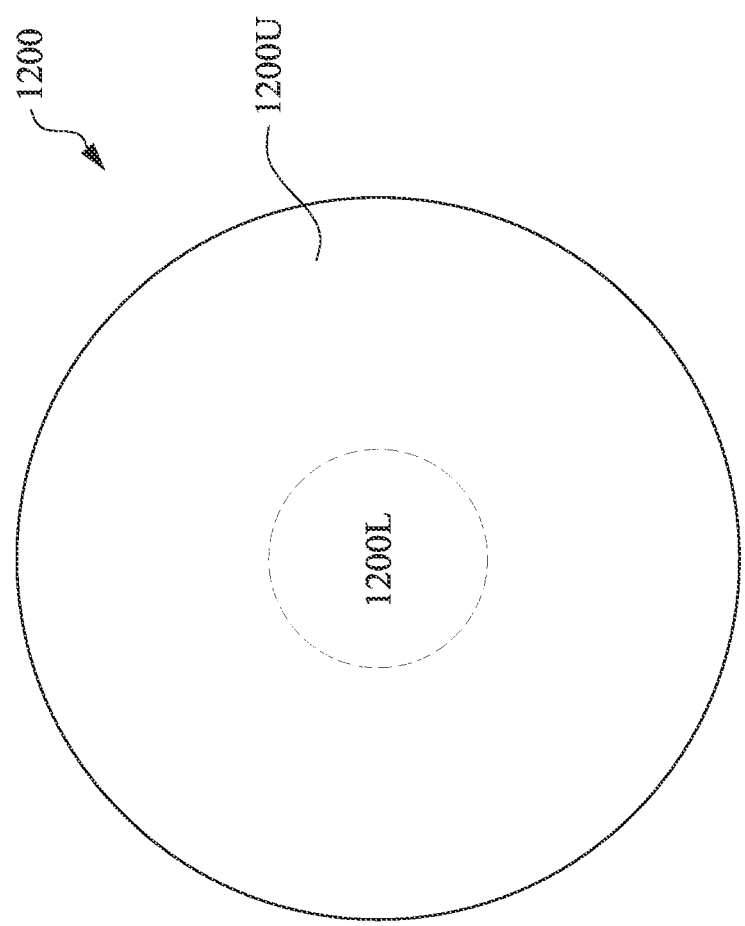
FIG. 12 illustrates an example top view of a contact feature, made by the method of FIG. 1, in accordance with some embodiments.
Figure 13:
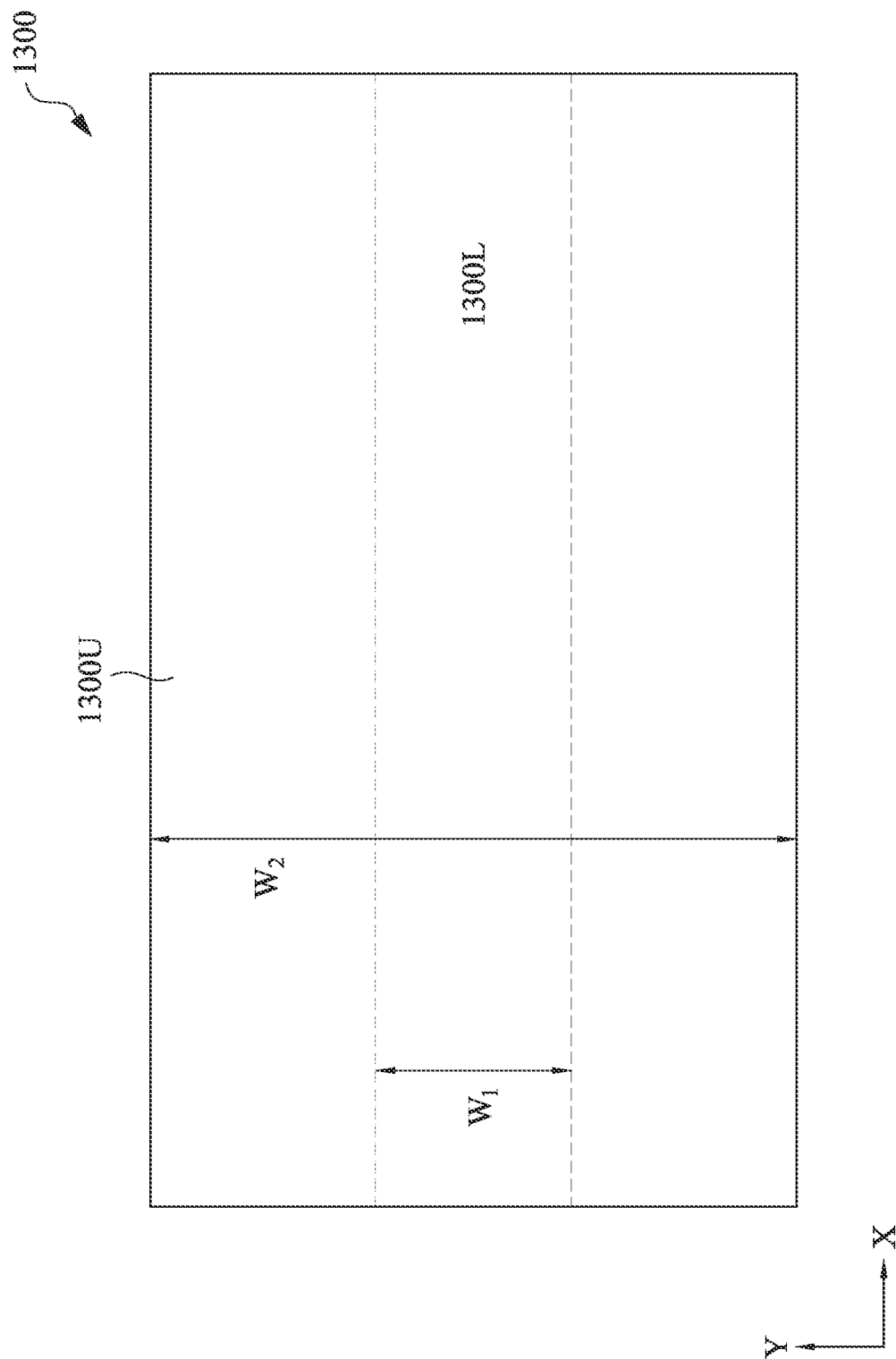
FIG. 13 illustrates another example top view of a contact feature, made by the method of FIG. 1, in accordance with some embodiments.

FIGS. 12 and 13 respectively illustrate example top views of the contact feature, as disclosed herein. For example in FIG. 12, contact feature 1200 includes upper portion 1200U and lower portion 1200L. In some embodiments, the upper portion 1200U and lower portion 1200L can be each formed as a circular-based shape and concentric with one another. As such, the lower portion 1200L may be characterized with a diameter (or cross-sectional length) less than a diameter (or cross-sectional length) of the upper portion 1200U. In another example in FIG. 13, contact feature 1300 includes upper portion 1300U and lower portion 1300L. In some embodiments, the upper portion 1300U and lower portion 1300L are each formed as a square-based or rectangle-based shape that extends along a certain direction (e.g., the X direction). As such, the lower portion 1300L may be characterized with a width (or cross-sectional length) W2 (in a direction perpendicular to the X direction) less than a width (or cross-sectional length) W1 of the upper portion 1300U.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In an embodiment, a method of fabricating a semiconductor device includes recessing an upper portion of a first dielectric layer disposed over a conductive feature. The method includes filling the recessed upper portion with a second dielectric layer to form a void embedded in the second dielectric layer. The method includes etching the second dielectric layer and the first dielectric layer to form a contact opening that exposes at least a portion of the conductive feature using the void to vertically align at least a lower portion of the contact opening with the conductive feature. The method includes filling the contact opening with a conductive material to form a contact feature electrically coupled to the conductive feature.

In another embodiment, a method of fabricating a semiconductor device includes depositing a first dielectric layer over a first conductive feature. The method includes forming a first opening in an upper portion of the first dielectric layer over the first conductive feature. The method includes depositing a second dielectric layer to fill the first opening, resulting in a void disposed over the first conductive feature. The method includes recessing the second dielectric layer and the first dielectric layer to form a second opening that exposes the first conductive feature, where the second opening extends away from the first opening and is vertically aligned with the void. The method includes forming a second conductive feature to fill the first opening and the second opening.

In yet another embodiment, a method of fabricating a semiconductor device includes forming a first dielectric layer over a conductive feature. The method includes etching the first dielectric layer to form a recessed portion over the conductive feature. The method includes depositing a second dielectric layer in the recessed portion, thereby forming a void over the conductive feature. The method includes etching the second dielectric layer and the first dielectric layer to expose the conductive feature in a contact opening, where the void is used to vertically align a lower portion of the contact opening with the conductive feature. The method includes forming a contact feature to fill the contact opening.

What is claimed is:

1. A method, comprising:
   recessing an upper portion of a first dielectric layer disposed over a conductive feature;
   filling the recessed upper portion with a second dielectric layer to form a void embedded in the second dielectric layer;
   etching the second dielectric layer and the first dielectric layer to form a contact opening that exposes at least a portion of the conductive feature using the void to vertically align at least a lower portion of the contact opening with the conductive feature; and
   filling the contact opening with a conductive material to form a contact feature electrically coupled to the conductive feature.

2. The method of claim 1, wherein filling the recessed upper portion with the second dielectric layer to form the void comprises adjusting a deposition rate of filling the second dielectric layer to form an overhang of the second dielectric layer that includes a first portion and a second portion laterally extending toward each other to enclose the void.

3. The method of claim 1, wherein etching the second dielectric layer and the first dielectric layer to form the contact opening comprises etching a portion of the second dielectric layer and a portion of the first dielectric layer, both being vertically aligned with the void, to leave a remaining portion of the second dielectric layer extending along an inner sidewall of an upper portion of the contact opening.

4. The method of claim 1, wherein etching the second dielectric layer and the first dielectric layer to form the contact opening comprises:
   etching the second dielectric layer and the first dielectric layer to form an upper portion of the contact opening while leaving a remaining portion of the second dielectric layer extending along an inner sidewall of the upper portion of the contact opening; and
   etching the first dielectric layer to expose the conductive feature by forming the lower portion of the contact opening.

5. The method of claim 1, further comprising, prior to etching the second dielectric layer and the first dielectric layer to form the contact opening, polishing the first dielectric layer and the second dielectric layer to form a planar surface.

6. The method of claim 1, wherein a first lateral width of the recessed upper portion is greater than a second lateral width of the lower portion of the contact opening.

7. The method of claim 1, wherein a first lateral width of the recessed upper portion is three times or more than a second lateral width of the lower portion of the contact opening.

8. A method, comprising:
   depositing a first dielectric layer over a first conductive feature;
   forming a first opening in an upper portion of the first dielectric layer over the first conductive feature;
   depositing a second dielectric layer to fill the first opening, resulting in a void disposed over the first conductive feature;
   recessing the second dielectric layer and the first dielectric layer to form a second opening that exposes the first conductive feature, wherein the second opening extends away from the first opening and is vertically aligned with the void; and
   forming a second conductive feature to fill the first opening and the second opening.

9. The method of claim 8, wherein depositing the second dielectric layer comprises adjusting a rate of deposition such that portions of the second dielectric layer merge toward each other to form the void.

10. The method of claim 8, wherein recessing the second dielectric layer and the first dielectric layer leaves portions of the second dielectric layer along sidewalls of the first opening.

11. The method of claim 8, wherein recessing the second dielectric layer and the first dielectric layer results in the second opening to have the same width as the void.

12. The method of claim 8, wherein recessing the second dielectric layer and the first dielectric layer comprises:
   performing a first etching process to remove a portion of the first dielectric layer below the first opening, thereby forming the second opening; and
   subsequently performing a second etching process to extend the second opening, thereby exposing the first conductive feature.

13. The method of claim 8, wherein a first width of a top portion of the first opening is greater than a second width of the second opening.

14. The method of claim 8, wherein forming the first opening in the upper portion of the first dielectric layer results in the first opening to have an aspect ratio of greater than 1.5.

15. The method of claim 8, wherein the first opening and the second opening are formed to have a circular-based shape in a top view.

16. The method of claim 8, wherein the first opening and the second opening are formed to have a rectangular-based shape in a top view.

17. A method, comprising:
   forming a first dielectric layer over a conductive feature;
   etching the first dielectric layer to form a recessed portion over the conductive feature;
   depositing a second dielectric layer in the recessed portion, thereby forming a void over the conductive feature;
   etching the second dielectric layer and the first dielectric layer to expose the conductive feature in a contact opening, wherein the void is used to vertically align a lower portion of the contact opening with the conductive feature; and
   forming a contact feature to fill the contact opening.

18. The method of claim 17, further comprising planarizing the first dielectric layer and the second dielectric layer before etching the second dielectric layer and the first dielectric layer.

19. The method of claim 17, wherein a first lateral width of the recessed portion is greater than a second lateral width of the lower portion of the contact opening.

20. The method of claim 17, wherein depositing the second dielectric layer in the recessed portion comprises adjusting a deposition rate of the second dielectric layer to form a first portion and a second portion of the second dielectric layer that laterally extend toward each other to enclose the void.

* * * * *